(12) United States Patent
Chen

(10) Patent No.: US 11,657,990 B2
(45) Date of Patent: May 23, 2023

(54) INPUT MODULE AND ELECTRONIC DEVICE

(71) Applicant: Acer Incorporated, New Taipei (TW)

(72) Inventor: Hung-Chi Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 148 days.

(21) Appl. No.: 17/325,229

(22) Filed: May 20, 2021

(65) Prior Publication Data
US 2022/0115194 A1 Apr. 14, 2022

(30) Foreign Application Priority Data
Oct. 13, 2020 (TW) .................. 109135258

(51) Int. Cl.
*H01H 3/12* (2006.01)
*H01H 13/7073* (2006.01)
*G01R 33/00* (2006.01)

(52) U.S. Cl.
CPC ..... *H01H 13/7073* (2013.01); *G01R 33/0005* (2013.01); *G01R 33/0047* (2013.01); *H01H 3/125* (2013.01)

(58) Field of Classification Search
CPC ...... H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; H01H 36/00; H01H 2003/506; H01H 2036/0093; H01H 36/002
See application file for complete search history.

(56) References Cited

U.S. PATENT DOCUMENTS

| | | | |
|---|---|---|---|
| 2006/0132446 A1* | 6/2006 | Soh ...................... | G06F 3/0202 345/168 |
| 2013/0154940 A1* | 6/2013 | Gan ................... | H01H 36/0073 335/207 |
| 2015/0194277 A1 | 7/2015 | Bokma et al. | |

FOREIGN PATENT DOCUMENTS

| | | |
|---|---|---|
| CN | 205828228 | 12/2016 |
| CN | 208548321 | 2/2019 |
| TW | 201036019 | 10/2010 |
| TW | M517405 | 2/2016 |

* cited by examiner

*Primary Examiner* — Ahmed M Saeed
(74) *Attorney, Agent, or Firm* — JCIPRNET

(57) ABSTRACT

An input module includes a base, a keycap assembly and an identification unit. The base includes a magnetic sensor. The keycap assembly is assembled on the base, and the keycap assembly includes a magnetic element. The identification unit is electrically coupled to the magnetic sensor, and the identification unit determines the type of the keycap assembly according to the characteristics of magnetic field lines of the magnetic element sensed by the magnetic sensor. An electronic device is also disclosed.

12 Claims, 8 Drawing Sheets

INPUT MODULE AND ELECTRONIC DEVICE

CROSS-REFERENCE TO RELATED APPLICATION

This application claims the priority benefit of Taiwan application serial no. 109135258, filed on Oct. 13, 2020. The entirety of the above-mentioned patent application is hereby incorporated by reference herein and made a part of this specification.

BACKGROUND OF THE INVENTION

1. Field of the Invention

The invention relates to an input module and an electronic device.

2. Description of Related Art

Generally speaking, most of the key structures of existing keyboards only have the functions of on and off. When the key is pressed down, the switch circuit of the key is turned on to enable input of a corresponding command, and the switch circuit of the key is turned off to terminate the command when the key is released and rebounds. However, existing keyboards no longer meet the needs of e-sports players as e-sports games become more popular. For example, some game programs further require keys of the keyboard to simultaneously reflect speed, movement strength, direction, and continuous control of the movement process. Therefore, related keyboards with linear keys have also come into existence, which allow game programs to determine the delay time or speed of output commands by the force of pressing the keys to achieve the aforementioned control effects.

However, for users, they need to change the corresponding keyboard according to different usage environments or objects, which causes inconvenience in use. Therefore, how to improve the scope of the application of keyboards and enhance the convenience is actually a problem that relevant technicians need to think about and solve.

SUMMARY OF THE INVENTION

The invention provides an input module and an electronic device. The keycap of the input module can be replaced, and the type of the keycap is sensed by a magnetic sensor, and the users can further set the pressing stroke and trigger mechanism of the keycap through an operation interface of the electronic device.

The input module of the invention includes a base, a keycap assembly and an identification unit. The base includes a magnetic sensor. The keycap assembly is assembled on the base, and the keycap assembly includes a magnetic element. The identification unit is electrically coupled to the magnetic sensor, and the identification unit determines the type of the keycap assembly according to characteristics of magnetic field lines of the magnetic element sensed by the magnetic sensor.

The electronic device of the invention includes an input module and a control module. The input module includes a base, a keycap assembly and an identification unit. The base includes a magnetic sensor. The keycap assembly is assembled on the base, and the keycap assembly includes a magnetic element. The identification unit is electrically coupled to the magnetic sensor, and the identification unit determines the type of the keycap assembly according to characteristics of magnetic field lines of the magnetic element sensed by the magnetic sensor. The control module provides an operation interface according to the type of the keycap assembly, and the operation interface is configured to set a pressing stroke and a trigger mechanism of the keycap assembly.

Based on the above, in the input module of the invention, the magnetic sensor is disposed on the base and configured to sense the magnetic element of the keycap assembly. Therefore, the identification unit of the input module is able to determine the type of the keycap assembly according to the characteristics of the magnetic field lines of the magnetic element sensed by the magnetic sensor, and key functions corresponding to the type of the key assembly may be provided. Through the operation interface of the electronic device, the users are able to further set the pressing stroke and trigger mechanism of the keycap.

In order to make the aforementioned features and advantages of the invention more comprehensible, the embodiments accompanied with drawings are described in detail below.

DESCRIPTION OF THE EMBODIMENTS

Figure 1:
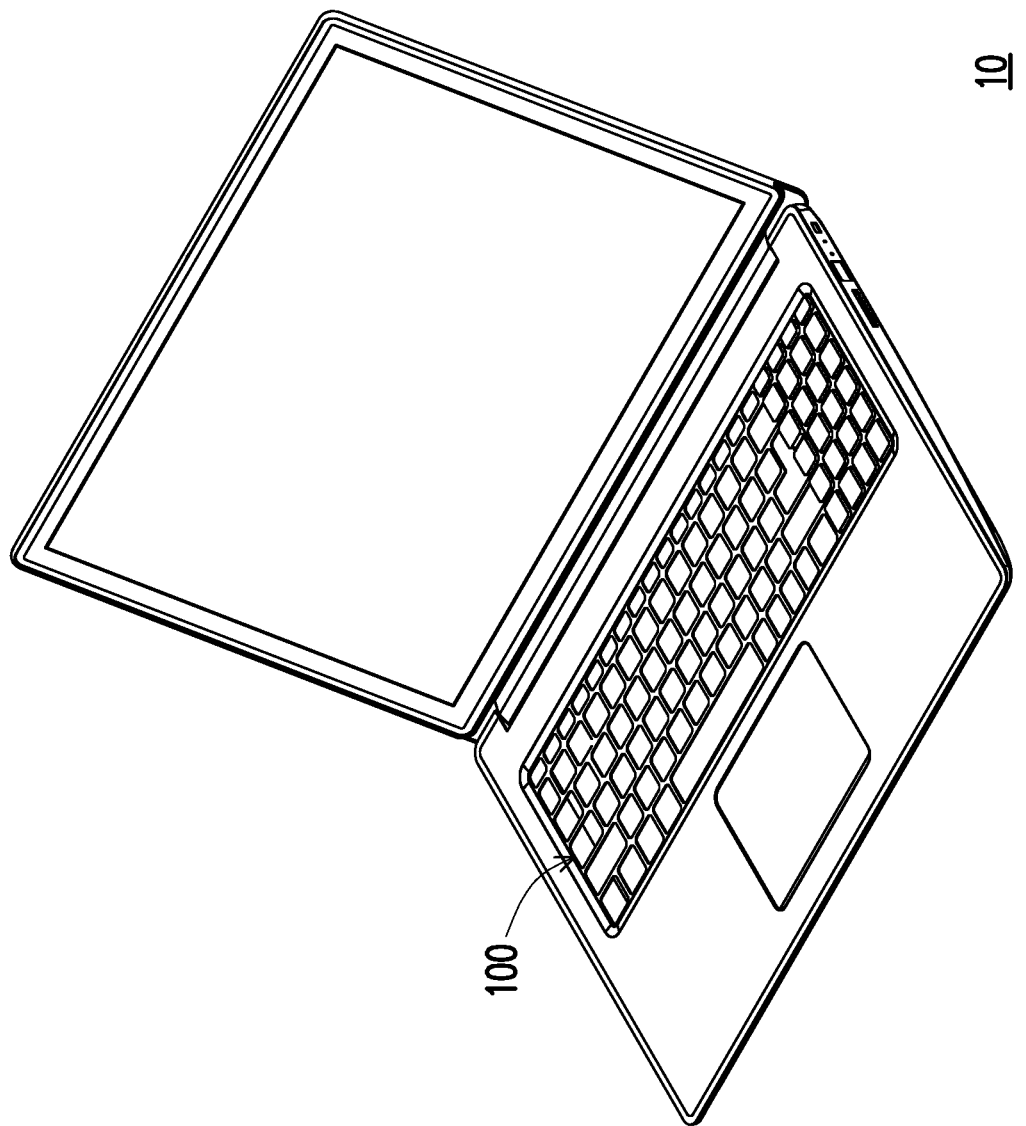
FIG. 1 is a schematic diagram of the input module according to the first embodiment of the invention.
Figure 2A:
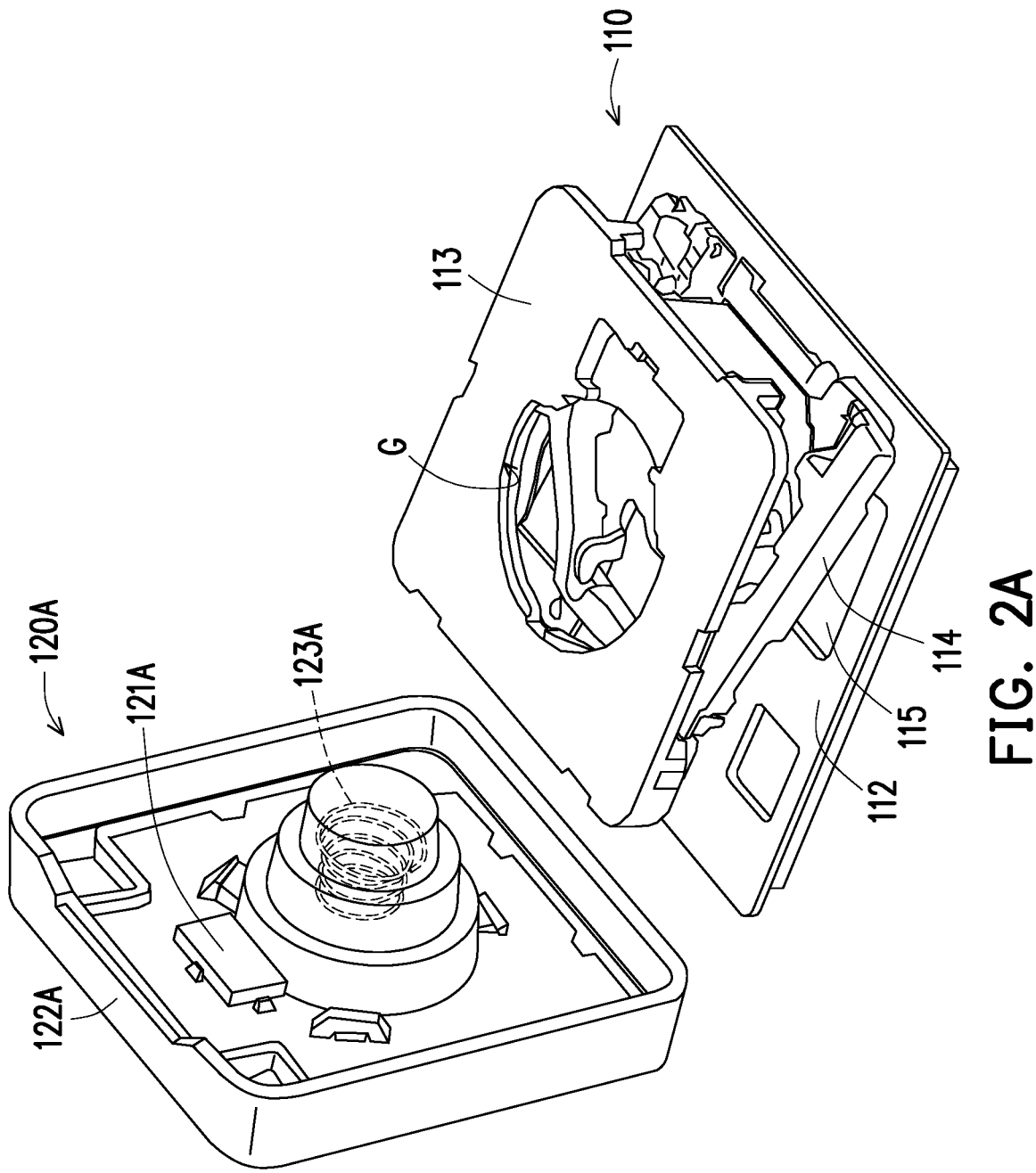
FIG. 2A and FIG. 2B are respectively schematic diagrams of different types of keycap assemblies of the input module of FIG. 1 separated from the base.
Figure 2B:
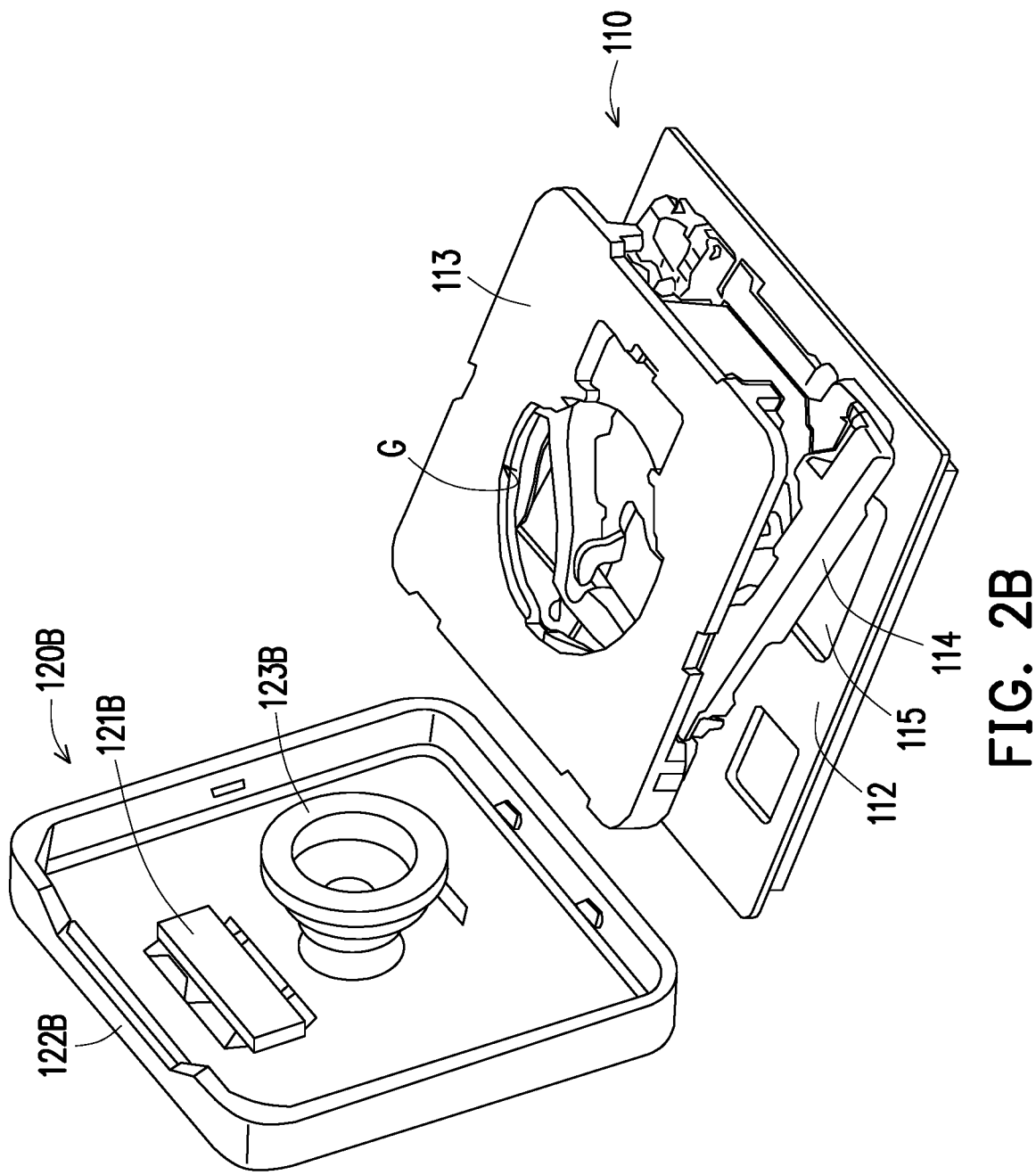
Figure 3A:
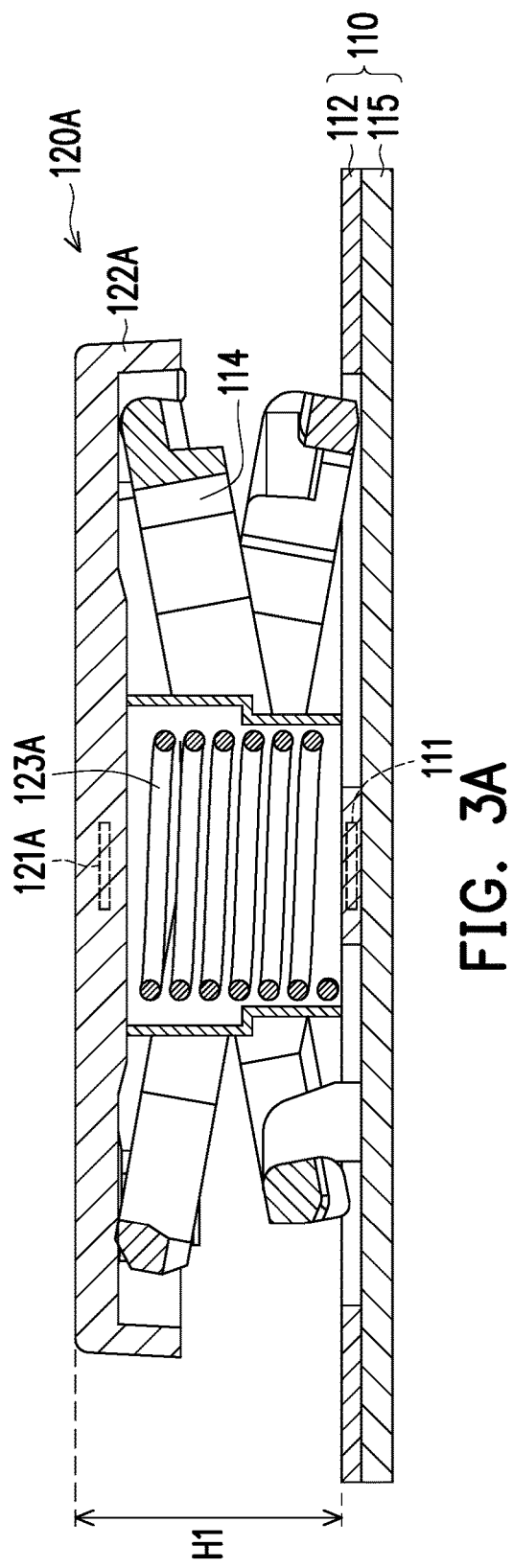
FIG. 3A and FIG. 3B are respectively side views of the keycap assemblies of FIG. 2A and FIG. 2B after being assembled to the base.
Figure 3B:
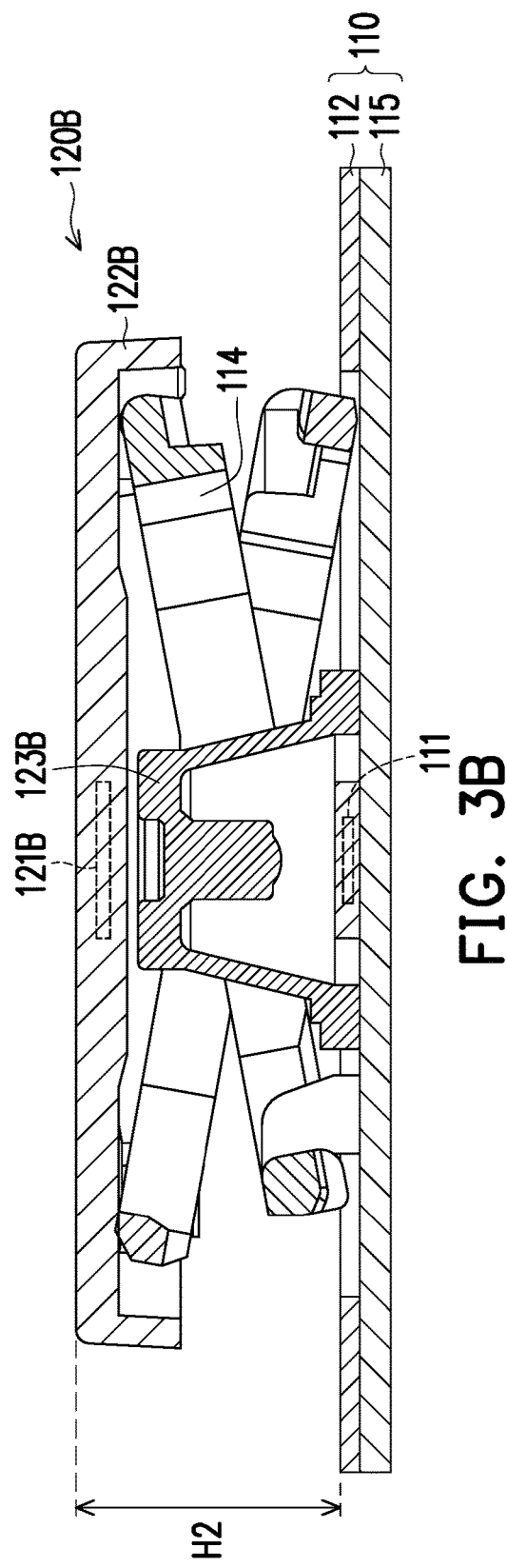

FIG. 1 is a schematic diagram of the input module according to the first embodiment of the invention. FIG. 2A and FIG. 2B are respectively schematic diagrams of different types of keycap assemblies of the input module of FIG. 1 separated from the base. FIG. 3A and FIG. 3B are respectively side views of the keycap assemblies of FIG. 2A and FIG. 2B after being assembled to the base. Note that FIG. 1 to FIG. 3B only schematically illustrate the relative positions of the components, and FIG. 1 to FIG. 3B are for reference only. The actual number and scale may not be similar to those shown in FIG. 1 to FIG. 3B. Please refer to FIG. 1; an input module 100 of the invention is adapted for an electronic device 10 (for example, a notebook computer), such as a built-in keyboard of a notebook computer. In other embodiments, the electronic device and the input module of the invention may be an external keyboard of a desktop computer or other computer systems with a physical keyboard.

Please refer to FIG. 2A and FIG. 3A. Note that FIG. 2A only shows a single key structure in the input module 100 for ease of description. In this embodiment, the input module 100 includes a base 110 and a keycap assembly 120A. The base 110 includes a circuit board 112, a positioning board 113, a scissors mechanism 114 and a bottom board 115. The circuit board 112 is disposed on the bottom board 115. The positioning board 113 is disposed on the circuit board 112. The scissors mechanism 114 is disposed between the positioning board 113 and the circuit board 112, and the positioning board 113 may be lifted relative to the circuit board 112 by the scissors mechanism 114. Here, the circuit board 112 is, for example, a thin film circuit, but the circuit board is not limited thereto.

The keycap assembly 120A includes a magnetic element 121A, a keycap 122A, and a shaft member 123A. Here, the shaft member 123A is a spring (such as a linear spring) assembled to the keycap 122A, and the keycap 122A abuts against the circuit board 112 via the shaft member 123A. Accordingly, the positioning board 113 and the keycap assembly 120A on the positioning board 113 may move up and down relative to the base 110 by the scissors mechanism 114. When the keycap 122A is pressed, the spring deforms linearly and thus forms a linear key structure. The linear key structure described here refers to the key structure that provides commands of speed, movement strength, direction, and continuous control of the movement process according to the degree of pressing the keycap 122A, which is regarded as a "linear axis" here.

Furthermore, as shown in FIG. 2A, the circuit board 112, an opening of the positioning board 113 and the scissors mechanism 114 of this embodiment form a mounting slot G, and the keycap assembly 120A is assembled on the base 110 to accommodate the shaft member 123A in the mounting slot G. In particular, the keycap assembly 120A of this embodiment is adapted for being detached from the positioning board 113. In other words, the input module 100 of this embodiment allows the users to replace the keycap assembly 120A to correspond to the required operating environment.

Please refer to FIG. 2B and FIG. 3B. The key structures shown in FIG. 2B and FIG. 3B are mostly the same as the key structures shown in FIG. 2A and FIG. 3A, and descriptions thereof are not repeated here. The difference is that a keycap assembly 120B is used in FIG. 2B and FIG. 3B. The keycap assembly 120B includes a magnetic element 121B, a keycap 122B, and a shaft member 123B. Here, the shaft member 123B is a rubber dome assembled to the keycap 122B. When the keycap 122B is pressed, the rubber dome deforms nonlinearly, and thus forms a nonlinear key structure, which belongs to the standard key structure. That is, the keycap 122B only provides simple commands for on/off, which is regarded as a "standard axis" here.

As mentioned above, FIG. 2A and FIG. 2B show that there are different types of keycap assemblies 120A and 120B which can be replaced by the users to facilitate the handling of different usage environments. Accordingly, in the input module 100 of the embodiment, when the users replace the keycap assemblies 120A and 120B, the input module 100 can therefore determines the type of the keycap assembly 120A or the keycap assembly 120B, and subsequently provides the corresponding functional commands in the operation.

Figure 4:
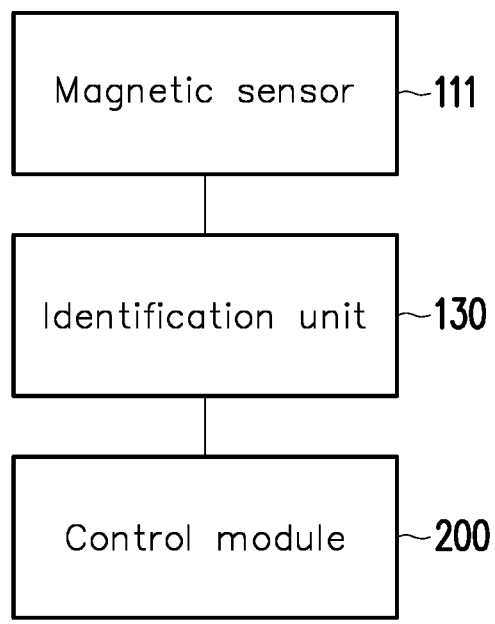
FIG. 4 is a schematic diagram of the electrical relationship of some components in the input module of FIG. 1.

In detail, as shown in FIGS. 3A and 3B, the base 110 includes a magnetic sensor 111, such as a Hall sensor. FIG. 4 is a schematic diagram of the electrical relationship of some components in the input module of FIG. 1. The input module 100 of this embodiment further includes an identification unit 130 electrically coupled to the magnetic sensor 111. The identification unit 130 determines whether it is the keycap assembly 120A or the keycap assembly 120B that is installed on the base 110 by the users according to the characteristics of the magnetic field lines of the magnetic element 121A or 121B sensed by the magnetic sensor 111.

In this embodiment, the size of the magnetic element 121A is different from the size of the magnetic element 121B. For example, the magnetic attraction force of the magnetic element 121A is smaller than the magnetic attraction force of the magnetic element 121B. Therefore, the number and the density of the magnetic field lines of the magnetic element 121A are different from those of the magnetic element 121B. Therefore, when the users replace the keycap assembly 120A or 120B, the identification unit 130 is able to identify the type of the keycap assembly 120A or 120B according to the characteristics of the magnetic field lines of the magnetic element 121A or the magnetic element 121B sensed by the magnetic sensor 111. In other embodiments, the characteristics of the magnetic field lines of the magnetic element are not limited to the above.

Figure 5:
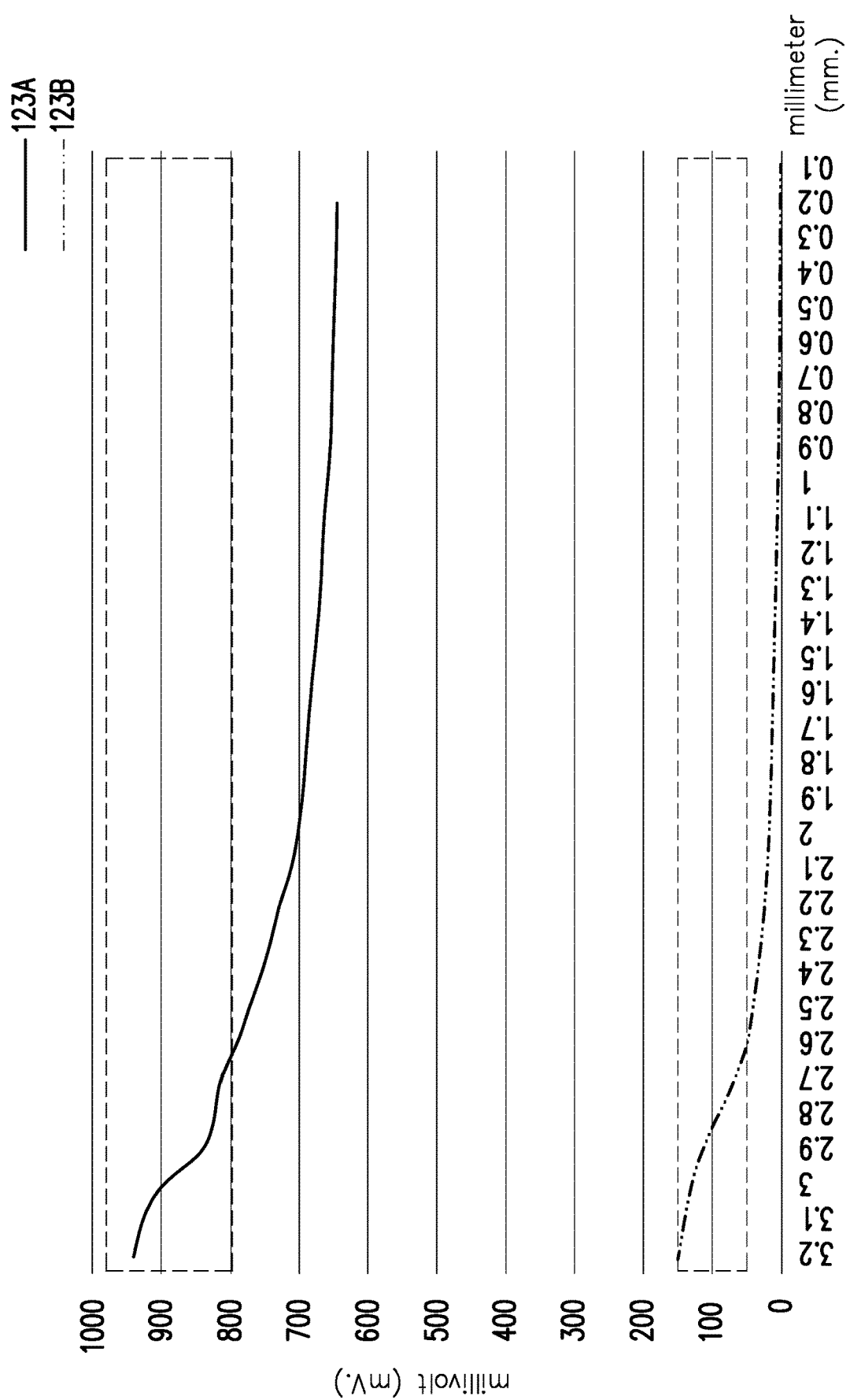
FIG. 5 is a schematic diagram of the characteristics of the magnetic field lines of the keycap assembly in the input module according to an embodiment of the invention.

FIG. 5 is a schematic diagram of the characteristics of the magnetic field lines of the keycap assembly in the input module according to an embodiment of the invention. It is known through experiments that the magnetic sensor 111 can sense the characteristics of the magnetic field lines when the keycap assembly 120A or the keycap assembly 120B is assembled on the base 110. Therefore, the identification unit 130 may further calculate a voltage value according to the characteristics of the magnetic field lines sensed by the magnetic sensor 111 to determine whether it is the shaft member 123A or the shaft member 123B. For example, as shown in FIG. 5, the shaft member 123A has corresponding voltage values on different strokes to form a voltage-stroke curve. Therefore, the voltage range of the shaft member 123A may be obtained through multiple experiments, and therefore, the determination criterion may be induced. The same applies to the voltage-stroke curve of the shaft member 123B. In other words, it may be determined whether it is the "standard axis" or the "linear axis" that is assembled on the base 110 at this time from the voltage-stroke curve obtained by the magnetic sensor 111.

Figure 6:
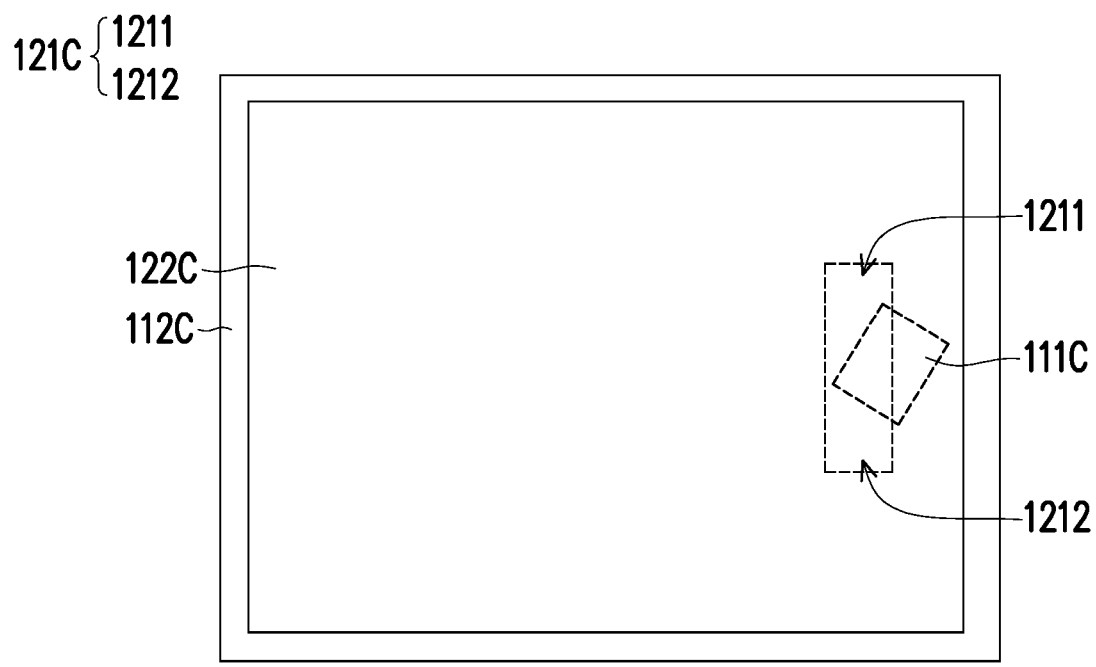
FIG. 6 is a schematic top view of the input module according to the second embodiment of the invention.
Figure 7:
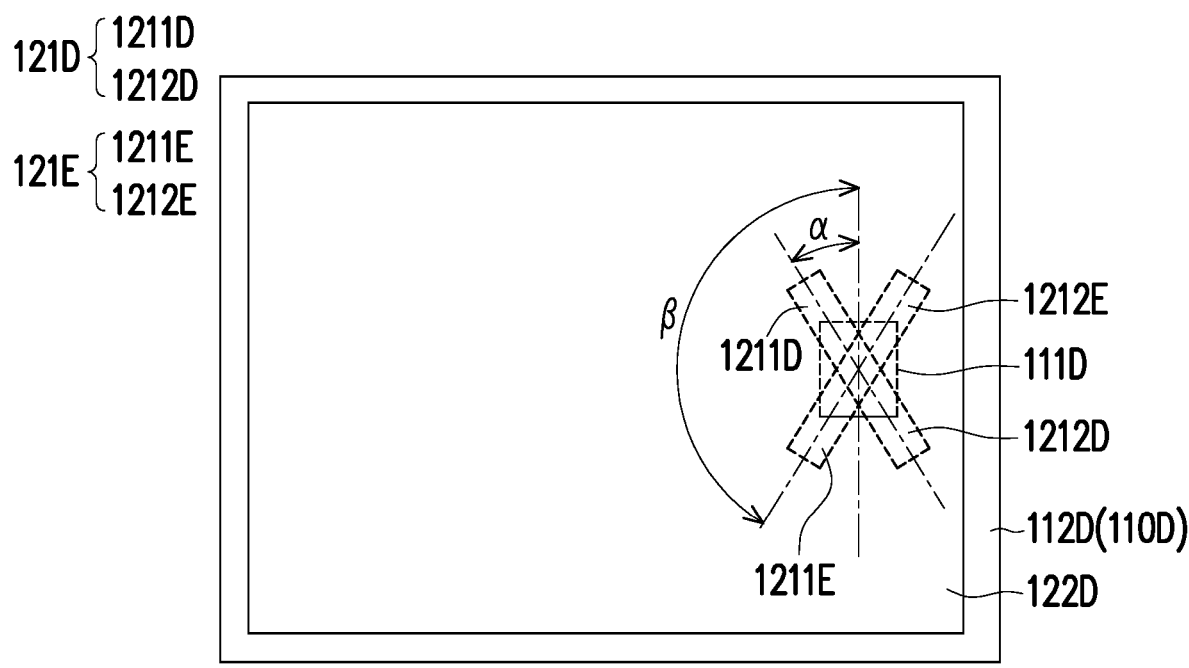
FIG. 7 is a schematic top view of the input module according to the third embodiment of the invention.

FIG. 6 is a schematic top view of the input module according to the second embodiment of the invention. FIG. 7 is a schematic top view of the input module according to the third embodiment of the invention. It should be noted that FIG. 6 and FIG. 7 only show a single key structure in the input module. In addition, some non-related structures are omitted in FIG. 6 and FIG. 7, and the relative positions of the components are simply drawn schematically only for reference so as to facilitate displaying and identifying different component parts.

Please refer to FIG. 6. In this embodiment, the characteristics of the magnetic field lines of the magnetic element may be, for example, the distribution orientations of the magnetic field lines. For example, in one type of keycap assembly, the polarity of the magnetic element 121C on the keycap 122C is the N pole at a first position 1211 shown in FIG. 6, and is the S pole at a second position 1212 shown in FIG. 6. In another type of keycap assembly, the magnetic element 121C is configured reversely. That is, the magnetic element 121C is rotated 180 degrees so that the polarity of the magnetic element 121C is the S pole at the first position 1211 shown in FIG. 6 and is the N pole at the second position 1212 shown in FIG. 6. Thereby, the magnetic sensor 111C on the circuit board 112C may identify the type of the keycap assembly by sensing the characteristics of the magnetic field lines of the magnetic element with different distribution orientations.

Please refer to FIG. 7. In this embodiment, the characteristics of the magnetic field lines of the magnetic element may be, for example, the distribution orientations of the magnetic field lines. For example, in one type of keycap assembly, a first end 1211D of the magnetic element 121D on the keycap 122D is the N pole, and a second end 1212D thereof is the S pole. There is an included angle α between the orthographic projection of the magnetic element 121D on the base 110D and the magnetic sensor 111D on the circuit board 112D. The drawing depicts the magnetic element of another type of keycap assembly to facilitate the comparison. For example, the first end 1211E of the magnetic element 121E is the N pole, and the second end 1212E is the S pole. There is an included angle β between the orthographic projection of the magnetic element 121E on the base and the magnetic sensor 111D on the circuit board 112D. Here, the included angle β is greater than the included angle α. Thereby, the identification unit may identify the type of the keycap assembly according to the characteristics of the magnetic field lines of the magnetic element with different distribution orientations sensed by the magnetic sensor.

Figure 8:
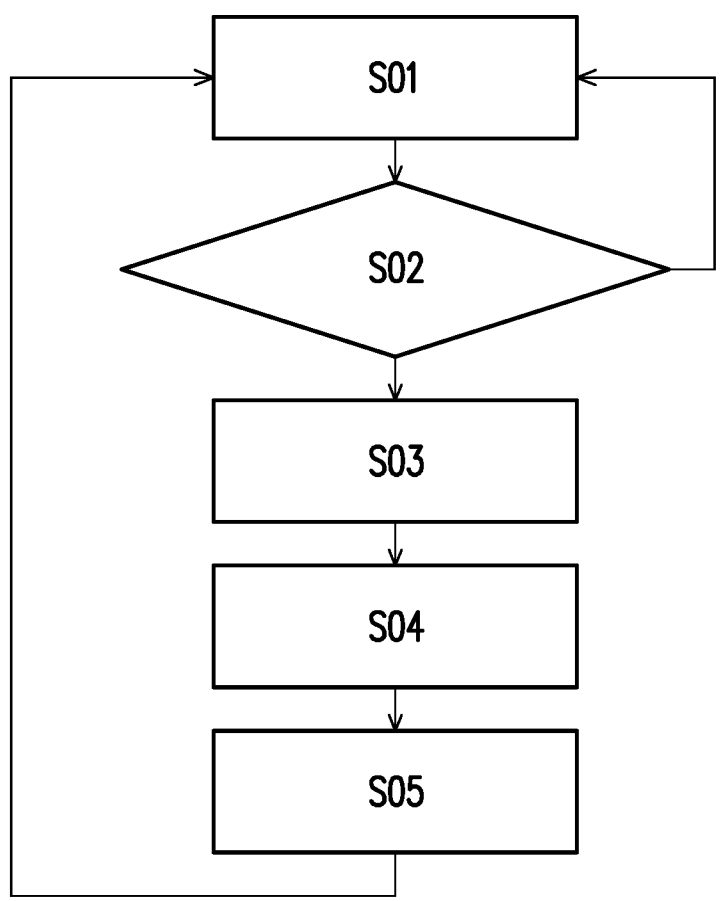
FIG. 8 is a flowchart of replacing the keycap assembly in the input module according to an embodiment of the invention.

FIG. 8 is a flowchart of replacing the keycap assembly in the input module according to an embodiment of the invention. Please refer to FIG. 8. When the users perform step S01, that is, after replacing the keycap assembly (for example, the above-mentioned keycap assembly is replaced between 120A and 120B), then in step S02, the magnetic elements 121A and 121B have different characteristics of the magnetic field lines for different types of keycap assemblies 120A and 120B. Furthermore, as shown in FIG. 4, the control module 200 of the electronic device 10 (shown in FIG. 1) is electrically coupled to the identification unit 130 and the magnetic sensor 111, so the control module 200 may determine the type of keycap assembly (the keycap assembly 120A or the keycap assembly 120B) according to the characteristics of the magnetic field lines of the magnetic element sensed by the magnetic sensor 111, and then step S03 is performed to automatically detect and switch to the corresponding axis mode. Therefore, the users can save the step of replacing the keycap assembly and then entering the system to select the linear or standard mode. On the other hand, when the control module 200 cannot determine which type the key structure is, it may mean that the keycap assembly has not been assembled to the mounting slot G, or there may be other assembly errors. At this time, the users return to step S01 from step S02, and re-perform the step of replacing the keycap assembly.

In this embodiment, the control module 200 of the electronic device 10 (shown in FIG. 1) provides an operation interface according to the type of the keycap assembly (the keycap assembly 120A or the keycap assembly 120B). Specifically, the operation interface is configured to set the pressing stroke and the trigger mechanism of the keycap assembly. For example, as shown in FIG. 3A and FIG. 3B, the height H1 of the keycap 122A of the non-linear key structure relative to the circuit board 112 of the base 110 is greater than the height H2 of the keycap 122B of the linear key structure relative to the circuit board 112 of the base 110. Therefore, the users may set the pressing stroke and the trigger mechanism of the keycap assembly in step S04, and close the operation interface after completing the setting. Then, step S05 is performed to turn on the magnetic sensor 111 to wait to detect the next axis change.

In summary, in the above-mentioned embodiments of the invention, the base of the input module includes the magnetic sensor, and different types of magnetic elements are respectively disposed on the keycaps of different types of keycap assemblies. The magnetic elements have different magnetic forces, or there are different distances, orientations or angles between the magnetic elements and the magnetic sensors. Therefore, there are differences in the characteristics of the magnetic field lines generated by the magnetic elements on different types of keycap assemblies. Through sensing the characteristics of the magnetic field lines of the magnetic element by the magnetic sensor, the control module of the electronic device may determine the type of the keycap assembly according to the characteristics of the magnetic field lines of the magnetic element sensed by the magnetic sensor to achieve effects of automatic detection and switching to the corresponding axis mode. Therefore, the users are able to save the step of replacing the keycap assembly and then entering the system to select the linear or standard mode, which further improves the convenience in operation. Furthermore, the users may set the pressing stroke of the keycap through the operation interface of the electronic device to make the height of the keycap of different keycap assemblies relative to the circuit board of the base the same, which is convenient for the users to operate.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An input module, comprising:
    a base including a magnetic sensor, a circuit board, a positioning board and a scissors mechanism, wherein the positioning board disposed on the circuit board, the scissors mechanism disposed between the positioning board and the circuit board, and the positioning board being configured for lifting relative to the circuit board by the scissors mechanism;
    a keycap assembly assembled on the base, and the keycap assembly including a magnetic element, a shaft member, the circuit board, an opening of the positioning board and the scissors mechanism form a mounting slot, and the keycap assembly is assembled to the base to make the shaft member accommodated in the mounting slot; and
    an identification unit electrically coupled to the magnetic sensor, and the identification unit determining the type of the keycap assembly according to characteristics of magnetic field lines of the magnetic element sensed by the magnetic sensor.

2. The input module according to claim 1, wherein the keycap assembly further includes a keycap, the shaft member is a rubber dome assembled to the keycap, and the keycap is adapted for being pressed to make the rubber dome deform nonlinearly.

3. The input module according to claim 1, wherein the keycap assembly further includes a keycap, the shaft member is a spring assembled to the keycap, and the keycap is adapted for being pressed to make the spring deform linearly.

4. The input module according to claim 1, wherein the characteristics of the magnetic field lines include the number and density of the magnetic field lines.

5. The input module according to claim 1, wherein the characteristics of the magnetic field lines include the distribution orientations of the magnetic field lines.

6. The input module according to claim 5, wherein there is an included angel between an orthographic projection of the magnetic element on the base and the magnetic sensor.

7. An electronic device, comprising:
an input module, comprising:
a base including a magnetic sensor, a circuit board, a positioning board and a scissors mechanism, wherein the positioning board disposed on the circuit board, the scissors mechanism disposed between the positioning board and the circuit board, and the positioning board being configured for lifting relative to the circuit board by the scissors mechanism;
a keycap assembly assembled on the base, the keycap assembly including a magnetic element, a shaft member, the circuit board, an opening of the positioning board and the scissors mechanism form a mounting slot, and the keycap assembly is assembled to the base to make the shaft member accommodated in the mounting slot; and
an identification unit electrically coupled to the magnetic sensor, the identification unit determining the type of the keycap assembly according to characteristics of magnetic field lines of the magnetic element sensed by the magnetic sensor; and
a control module providing an operation interface according to the type of the keycap assembly, the operation interface being configured to set a pressing stroke and a trigger mechanism of the keycap assembly.

8. The electronic device according to claim 7, wherein the keycap assembly further includes a keycap, the shaft member is a rubber dome assembled to the keycap, and the keycap is adapted for being pressed to make the rubber dome deform nonlinearly.

9. The electronic device according to claim 7, wherein the keycap assembly further includes a keycap, the shaft member is a spring assembled to the keycap, and the keycap is adapted for being pressed to make the spring deform linearly.

10. The electronic device according to claim 7, wherein the characteristics of the magnetic field lines include the number and density of the magnetic field lines.

11. The electronic device according to claim 7, wherein the characteristics of the magnetic field lines include the distribution orientations of the magnetic field lines.

12. The electronic device according to claim 11, wherein there is an included angel between an orthographic projection of the magnetic element on the base and the magnetic sensor.

* * * * *